(12) United States Patent
Kajiyama

(10) Patent No.: US 7,061,036 B2
(45) Date of Patent: Jun. 13, 2006

(54) MAGNETIC RANDOM ACCESS MEMORY AND A METHOD FOR MANUFACTURING THEREOF

(75) Inventor: Takeshi Kajiyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

(21) Appl. No.: 10/792,586

(22) Filed: Mar. 4, 2004

(65) Prior Publication Data

US 2004/0232460 A1    Nov. 25, 2004

(30) Foreign Application Priority Data

Mar. 4, 2003   (JP) .......................... P2003-057369

(51) Int. Cl.
*H01L 31/062*   (2006.01)

(52) U.S. Cl. ............... 257/295; 257/421; 257/E27.006; 257/758

(58) Field of Classification Search ................ 257/295, 257/421, E27.006, 758
See application file for complete search history.

(56) References Cited

U.S. PATENT DOCUMENTS

| | | | | |
|---|---|---|---|---|
| 6,440,753 | B1 | 8/2002 | Ning et al. | 438/3 |
| 6,807,087 | B2 * | 10/2004 | Deak | 365/158 |
| 2001/0023992 | A1 | 9/2001 | Doll | 257/777 |
| 2002/0190291 | A1 | 12/2002 | Hosotani | 257/295 |

* cited by examiner

*Primary Examiner*—Tu-Tu Ho
(74) *Attorney, Agent, or Firm*—Oblon, Spivak, McClelland, Maier & Neustadt, P.C.

(57) ABSTRACT

Magnetic random access memory including a cell array stacked in a plurality of plane levels, a plurality of write wirings disposed on each of the stacked cell array, and a contact plug commonly or independently coupled to the plurality of stacked array planes. Also, a method for manufacturing magnetic random access memory so as to reduce influences of parasitic wiring resistances due to differences of the writing current values for supplying the stacked cell array. The magnetic random access memory includes a cell array of TMR elements stacked in a plurality of plane levels, a plurality of write wirings being formed so that a parasitic resistance becomes smaller accompanying a longer distance from a drive current source, and one or a plurality of contact plugs for commonly or independently coupling to the plurality of stacked array planes.

16 Claims, 8 Drawing Sheets

MAGNETIC RANDOM ACCESS MEMORY AND A METHOD FOR MANUFACTURING THEREOF

CROSS-REFERENCE TO RELATED APPLICATION

This application claims the benefit of priority from Japanese Patent Application No. 2003-57369, filed on Mar. 4, 2003, the entire contents of which are hereby incorporated by reference in its entirety.

FIELD OF THE INVENTION

The present invention relates to a semiconductor device and a method for manufacturing thereof, and in particular, to magnetic random access memory (MRAM) that constitutes a memory cell for storing data "1" or "0" by utilizing a magnetic element having advantages of tunneling magneto resistive (TMR) effect.

BACKGROUND OF THE INVENTION

To store digital data, in recent years, there have been proposed various types of memories utilizing new principles. Particularly, a new type memory utilizing a tunneling magneto resistive (TMR) effect has been well known in the semiconductor field. For example, Roy Scheuerlein et al., have disclosed such TMR elements in a non-patent document titled "A 10 ns Read and Write Non-Volatile Memory Array Using a Magnetic Tunnel Junction and FET Switch in each Memory cell" at ISSCC2000 Technical Digest p. 128.

This TMR element is structured by interposing an insulation layer, i.e., a tunnel barrier layer, between a couple of ferromagnetic layers. TMR element can store digit data "1" or "0" by changing a magnetizing direction of the couple of ferromagnetic layers, respectively. Thus, when the couple of ferromagnetic layers are magnetized in the same direction with each other (this is referred as "magnetized in a parallel"), one digit data "1" is stored. On the other hand, when the couple of ferromagnetic layers are magnetized in a reverse direction with each other (this is referred as "magnetized in a counter-parallel"), another digit data "0" is stored.

Generally, a magnetizing direction is fixed for one of the couple of ferromagnetic layers constructing TMR element which is referred to as a fixed layer. Another layer of the couple of ferromagnetic layers is referred to as a free layer since the magnetizing direction is freely able to be changed in a parallel to the fixed layer or in a counter-parallel to the fixed layer in accordance with a change of write data. Thus, the magnetizing direction for the free layer may be changed depending upon a write data for storing digit data "1" or "0" in TMR element.

Also, recently, various device structures and circuit structures of Magneto-resistive Random Access Memory (MRAM) utilizing TMR elements have been proposed. For example, one type of MRAM device structure has been proposed in which a selecting switching element (transistor) is connected to a plurality of TMR elements in order to increase integration density of memory cells and also to improve reading margins as disclosed, for example, in Doll's U.S. Patent Application Publication 2001/0023992A1. The same assigner of this applicant also has proposed a MRAM cell array in which a plurality of TMR elements are connected in a parallel between an upper wiring and a lower wiring as disclosed in Japanese Patent Application Publication 2002-110993 which corresponds to a counter U.S. Patent No 2002/0190291 A1.

FIG. 7 illustrates a plane layout of one example of stacked cell arrays which is constructed by stacking a plurality of cell array planes as suggested in the above-mentioned Japanese Patent Application Publication 2002-110993 filed by the same assignee of the present invention. FIG. 8 is a conceptual cross section view of the stacked cell arrays obtained by cutting along X—X line in FIG. 7.

As illustrated in FIG. 7, each of the plurality of cell array planes includes a plurality of TMR elements 10 being arranged both X and Y directions. The plurality of array planes is stacked on a semiconductor substrate for increasing memory capacity. For simplifying explanations, the stacked cell arrays in this example are constructed by three cell array planes. A top level of the stacked cell array planes is shown by a solid line, a middle cell array plane is shown by a dotted line and a bottom cell array plane is shown by a dashed line. In each of the cell array planes, a plurality of TMR elements 10 is arranged along X-Y directions.

Each of TMR elements 10 is constructed by three layers including an upper free layer, a middle layer and a lower fixed layer. As illustrated in FIG. 8, an upper wiring 11 is connected to each of the free layers of the respective TMR elements 10 in the same plane level, and a lower wiring 12 is connected to each of the fixed layers of the TMR elements 10. Both wirings 11 and 12 extend along the Y (column) direction. In each of the cell array planes, a plurality of TMR elements 10 is disposed in a parallel between the upper wiring 11 and the lower wiring 12 along the X (raw) direction. Each one terminal of the respective lower wirings 12 is connected to one peripheral circuit, such as a sense amplifier (S/A). Each of the another terminals of the respective upper wirings 11 is connected to selection transistors 14, respectively. Namely, a plurality of write wirings 13 is disposed closely upon each of free layers for the respective TMR elements 10 so as to extend along the Y direction in each of the plurality of cell array planes.

In general, a large value of current is required to perform data write and read operations to and from TMR elements due to the characteristics of TMR elements. Particularly, when a plurality of TMR elements is constructed into a miniaturized form, a huge value of write current is required for changing a magnetizing direction of the magnetic layer of the respective TMR elements. It is also required to effectively control a value of a data write current in order to avoid interferences among adjoining cells.

When a plurality of cell array planes are stacked for a miniaturization, each connecting line of the write wirings for the cell arrays arranged on a top plane becomes longer than each connecting line of the write wirings for the memory cell array arranged on a bottom plane in order to connect to a current source for driving write operations. Further, the cell arrays arranged on a top plane require an increased number of contacts. These longer connecting lines and the increased number of contacts cause to increase parasitic wiring resistances. Consequently, the more increased number of TMR element arrays are stacked, the less reduced value of the writing current is generated at the top plane level due to the influences of the increased value of the parasitic wiring resistances. This causes to make difficult to effectively control each value of the writing currents at the respective plane levels. For instance, when a resistance value of a write wiring path of the top plane level becomes three times of a resistance value of a write wiring path of the bottom plane level, the writing current of the top plane level reduces almost one-third of the writing current of the bottom plane level.

This is a serious problem for a stacked cell arrays of TMR elements, since the cell arrays arranged on the top plane level require much more largely increased value of drive current for performing write operations even when the value of the writing current gradually reduces due to a miniaturization of the stacked cell arrays.

SUMMARY OF THE INVENTION

The present invention intends to solve the above-mentioned problems. Accordingly, the present invention provides a magnetic random access memory that can avoid the influences of the parasitic wiring resistances and a miniaturization effect of writing currents of a plurality of stacked cell array planes. Parasitic wiring resistances are gradually changed to reduce from the bottom plane level to the top plane level. Also, the present invention provides a magnetic random access memory that can effectively control a value of writing current so as to prohibit error writings even when TMR elements have small areas as a writing margin.

Consistent with the present invention, there is provided a magnetic random access memory comprising:

stacked cell arrays being constructed by a plurality of array planes of a plurality of TMR elements, each of TMR elements being formed by interposing an insulation layer between a couple of ferromagnetic layers;

a plurality of write wirings disposed on each of TMR elements in each of the plurality of the stacked cell arrays in order to supply a write current to each of the TMR elements, wherein the write wiring films may be formed so that a parasitic resistance value may become gradually reduce accompanying each of different distances of the respective array planes from a current source for driving the write wiring; and a contact plug commonly coupled to each of the plurality of array planes at both terminals of the respective array planes for supplying the write current to each of the plurality of write wiring films so that each of the write wiring films being configured to arrange in a stacked direction of the stacked cell arrays.

Also consistent with the present invention, there is provided a magnetic random access memory, comprising:

stacked cell arrays being constructed by a plurality of array planes of a plurality of TMR elements, each of TMR elements being formed by interposing an insulation layer between a couple of ferromagnetic layers;

a plurality of write wirings disposed on each of cell arrays in each of the plurality of the stacked cell arrays in order to supply a write current to each of the TMR elements, wherein the write wirings may be constructed so that a parasitic resistance value may become gradually smaller in accordance with each of distances of the respective array planes from a current source for driving the write wiring; and a plurality of contact plugs, each independently coupled to the write wirings in each of the array planes of the plurality of stacked cell arrays along a stacking direction so as to supply the write current to the respective write wirings from the current source.

Further consistent with the present invention, there is provided a method for manufacturing a magnetic random access memory, comprising: stacked cell arrays being constructed by a plurality of array planes of a plurality of TMR elements, each of TMR elements being structured by interposing an insulation layer between a couple of ferromagnetic layers; and a plurality of write wirings disposed on each of memory array cells in each of the plurality of the stacked cell arrays in order to supply a write current to each of the TMR elements, wherein the write wirings being formed so that a parasitic resistance value may become gradually smaller accompanying each of different distances of the respective array planes from a current source for driving the write wiring;

the method comprising:

commonly coupling a contact plug to each of the plurality of array planes at both terminals of the respective array planes; and supplying the write current to each of the plurality of write wirings so that each of the write wirings being configured to arrange in a stacked direction of the stacked cell arrays.

More particularly, in the embodiments consistent with the present invention, each of the write wirings in the memory cell arrays stacked in a plurality plane levels may be constructed so as to gradually change a thickness of each of the write wiring films or a width of each of the write wiring, or may be formed by a wiring material that gradually change a resistance value. Thus, a thickness of each of the write wiring films gradually becomes thicker toward to the top plane level, or a width of each of the write wiring becomes wider toward to the top plane level, or a resistance value of the wiring material becomes gradually smaller toward the top plane level. It is also possible to combine above-mentioned features of the embodiments consistent with the present invention. Further, a plurality of contact plugs in the cell array stacked in a plurality of plane levels consistent with the present invention may be constructed so as to gradually change a contact size as gradually larger size or as a gradually increased numbers or may be has a gradually smaller resistance value of the wiring material toward the top plane level.

BRIEF DESCRIPTION OF THE DRAWINGS

The accompanying drawings, which are incorporated in and constitute part of this specification, illustrates various embodiments and/or features of the invention and together with the description, serve to explain the invention. Wherever possible, the same reference number will be used throughout the drawings the same or like parts. In drawings.

DETAILED DESCRIPTION

Figure 1:
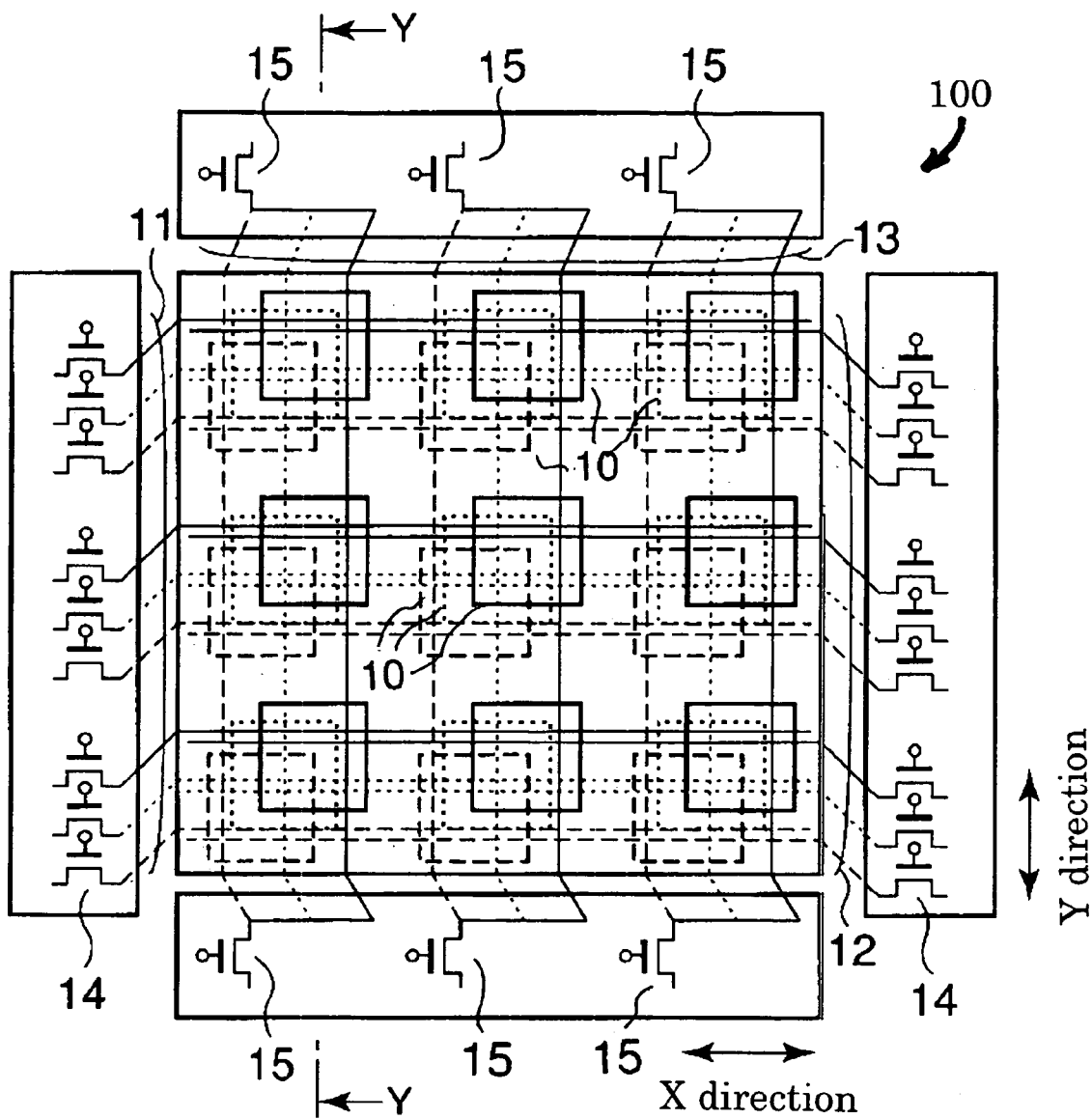
FIG. 1 is a plain view of an exemplary configuration of a layout of a stacked cell array for a magnetic random access memory in which methods and apparatus consistent with the present invention may be implemented.

Reference will now be made in detail to exemplary embodiments of the invention, examples of which are illustrated in accompanying drawings. Wherever possible, the same reference numbers will be used throughout the drawings to refer the same or like parts. As illustrated in FIG. 1, a magnetic random access memory (MRAM) 100 consistent with the present invention is comprised of a plurality of stacked cell array planes. Each of the plurality of planes includes a plurality of TMR element 10. As an exemplary configuration, MRAM 100 is comprised of a stacked array planes of different levels. As an example, FIG. 1 illustrates three different levels of array planes, i.e., an array plane of a top level is shown by a solid line, an array plane of a middle level is shown by a dotted line and an array plane of a bottom level is shown by a dashed line.

In FIG. 1, for easy understanding, each of a plurality of TMR elements 10 arranged on a plurality of plane levels and each of wirings connected to each of the plurality of the TMR elements 10 on each plane prolonged along both of X and Y directions are illustrated so as to be mutually shifted in each of different planes with each other. As a practical case, however, it may be also possible to completely arrange each of the TMR elements 10 so as to dispose at overlapped positions in each of plane levels. It may be also possible to arrange the TMR elements 10 so as to mutually shift in each of different planes as shown in FIG. 1. As illustrated in FIG. 1, the stacked cell array device 100 includes a plurality of write wirings 13 disposed in parallel in one row of each of the stacked plane levels. The plurality of write wirings 13 is commonly connected at both terminals of the cell arrays and connected to each of a column transistor 15 for driving the TMR elements during a write operation.

Figure 2:
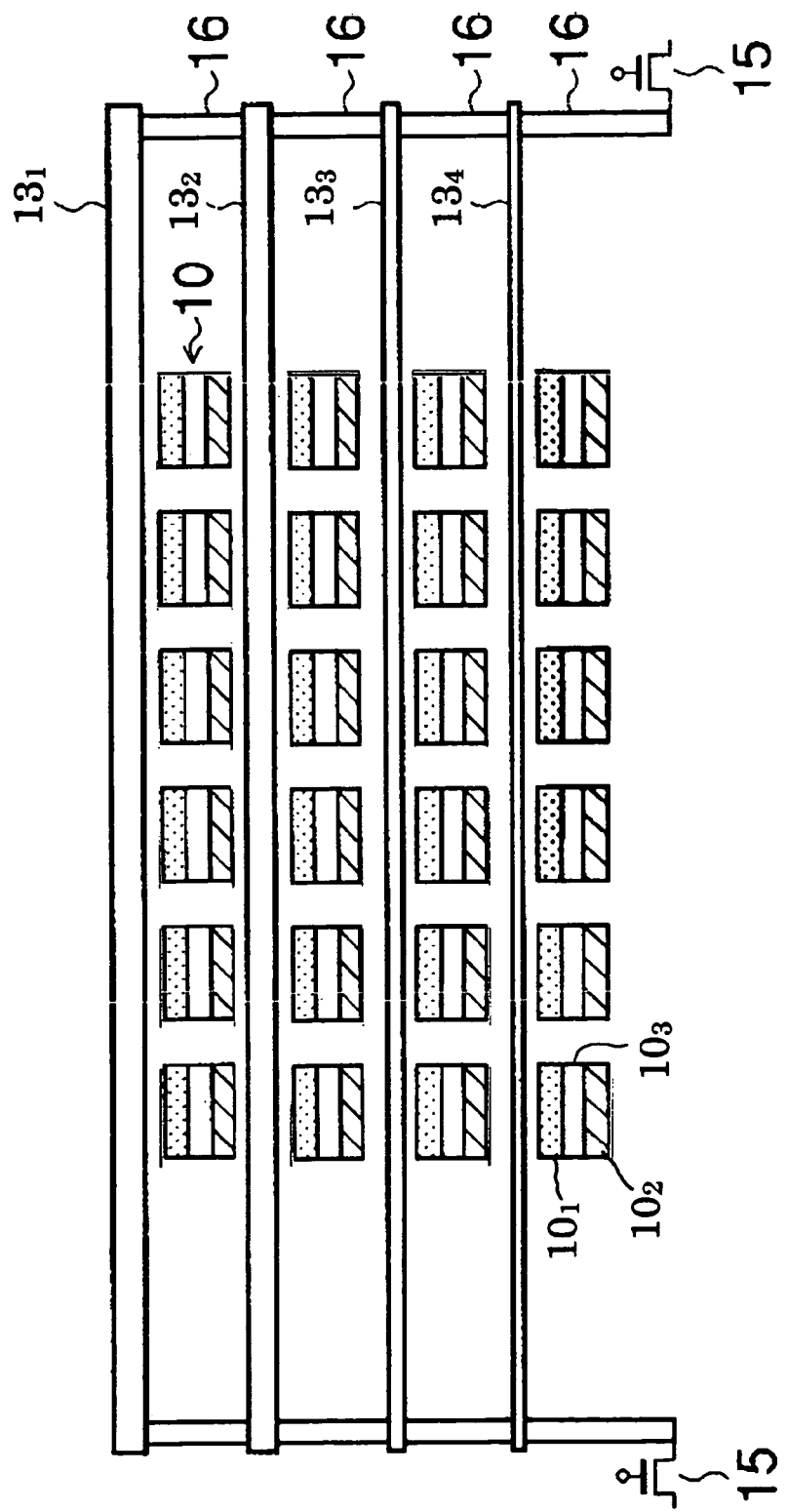
FIG. 2 is a cross section view of a simplified configuration of the stacked cell arrays being constructed by exemplary four different thicknesses of write wiring films which are obtained by cutting along a Y—Y line (Y direction) as illustrated in FIG. 1.

FIG. 2 is a simplified cross section view of an exemplary configuration of the stacked cell arrays which is obtained by cutting along a Y—Y line (Y direction) in FIG. 1. This example shows the cell arrays arranged on four plane levels. In each of the plane levels, a plurality of TMR elements 10 is disposed. Each of the plurality of TMR elements 10 arranged on a plane is comprised of a ferromagnetic free layer $10_1$ that is capable of changing a magnetizing direction and a ferromagnetic fixed layer 102 that is freely able to be changed in a parallel to the fixed layer $10_1$ or in a counter-parallel to the fixed layer $10_1$ in accordance with a change of write data. Although top wirings and bottom wirings are disposed on each row of the plurality of TMR elements 10 in each plane level, for a better understanding of the present invention, these wirings are omitted in FIG. 2. Top global wirings also are omitted in FIG. 2. Each of the TMR elements 10 is constructed by interposing an insulation layer $10_3$, i.e., a tunnel barrier layer, between two ferromagnetic layers $10_1$, $10_2$. The plurality of TMR elements 10 are stacked in a plurality plane levels on a semiconductor substrate (not shown). In each of the planes, a plurality of TMR elements 10 constitutes an array in an X-Y plane.

As explained before, each of the free layers $10_1$ of the respective TMR elements 10 on the same plane is connected to top wirings (not shown). Further, each of the fixing layers $10_2$ of the respective TMR elements 10 on the same plane are respectively connected to bottom wirings (not shown). Both the top and bottom wirings are respectively extending along a Y (column) direction of the cell array. A plurality of TMR elements 10 is disposed in a parallel along an X (row) direction between the both top and bottom wirings. As illustrated in FIG. 1, each row of the plurality of TMR elements 10 is connected to each of a plurality of selection transistors 14 at one terminal of the respective top wirings. At another terminal of the bottom wirings, a peripheral circuit, such as sense amplifier (S/A) is coupled through a plurality of selection transistors 14. In each of plane levels, each of the plurality of write wirings 13 are closely disposed to each of free layers $10_1$ of the respective TMR elements 10. The plurality of write wirings 13 also extends along a Y (column) direction.

As conceptually illustrated in FIG. 2, the stacked cell arrays consistent with the invention is constructed so that a plurality of write wiring 13 disposed in a parallel on each of a plurality rows in the stacked plural plane level is commonly connected to one selection transistor 15 at one terminal of the cell arrays. Thus, the top write wiring $13_1$ and the bottom write wiring $13_4$ are electrically connected through a plurality of contact plugs 16 at both terminals of the array so as to face with each other at peripheries of the array. The plurality of contact plugs 16 connects each of the write wirings $13_1$–$13_4$. Thus, the bottom set of contact plugs 16 connects to an upper write wirings $13_4$, and the third set of contact plugs 16 connects to an upper write wirings $13_3$, and so on.

Accordingly, a whole configuration of the plurality of write wirings $13_1$–$13_4$ of the cell array consistent with the invention in an X-Y plane is disposed in a ladder shape. This feature is advantageous to reduce the total number of writing drive transistors 15 disposed at peripheries of the array structure. This configuration also becomes possible to perform an easy control of the data write operation, since a current flowing in the respective write wirings 13 in each plane becomes in the same directions.

The plurality of write wirings 13 in each plane level of the magnetic random access memory consistent with the present invention are commonly connected to a writing wire driving current source (not shown) through each of the commonly connected writing selection transistor 15 so that a parasitic resistance value becomes gradually smaller accompanying a gradually longer distance of the write wiring from a drive current source. According to one embodiment, a film thickness of each of the plurality of write wiring $13_1$–$13_4$ is formed so as to become gradually thicker accompanying approach to the top plane level. That is, write wiring $13_1$ is thicker than $13_2$ is thicker than $13_3$ is thicker than $13_4$. By gradually changing the film thickness of the write wiring $13_1$–$13_4$, it becomes possible to maintain each value of currents flowing in each of the write wirings in each plane level as a substantially the same value. Thus, the respective film thickness of write wirings is designed so as to keep a substantially equal current value with each other, even when the respective distances of the write wiring from the current source changes accompanying the plane level in the cell array structure.

Figure 6:
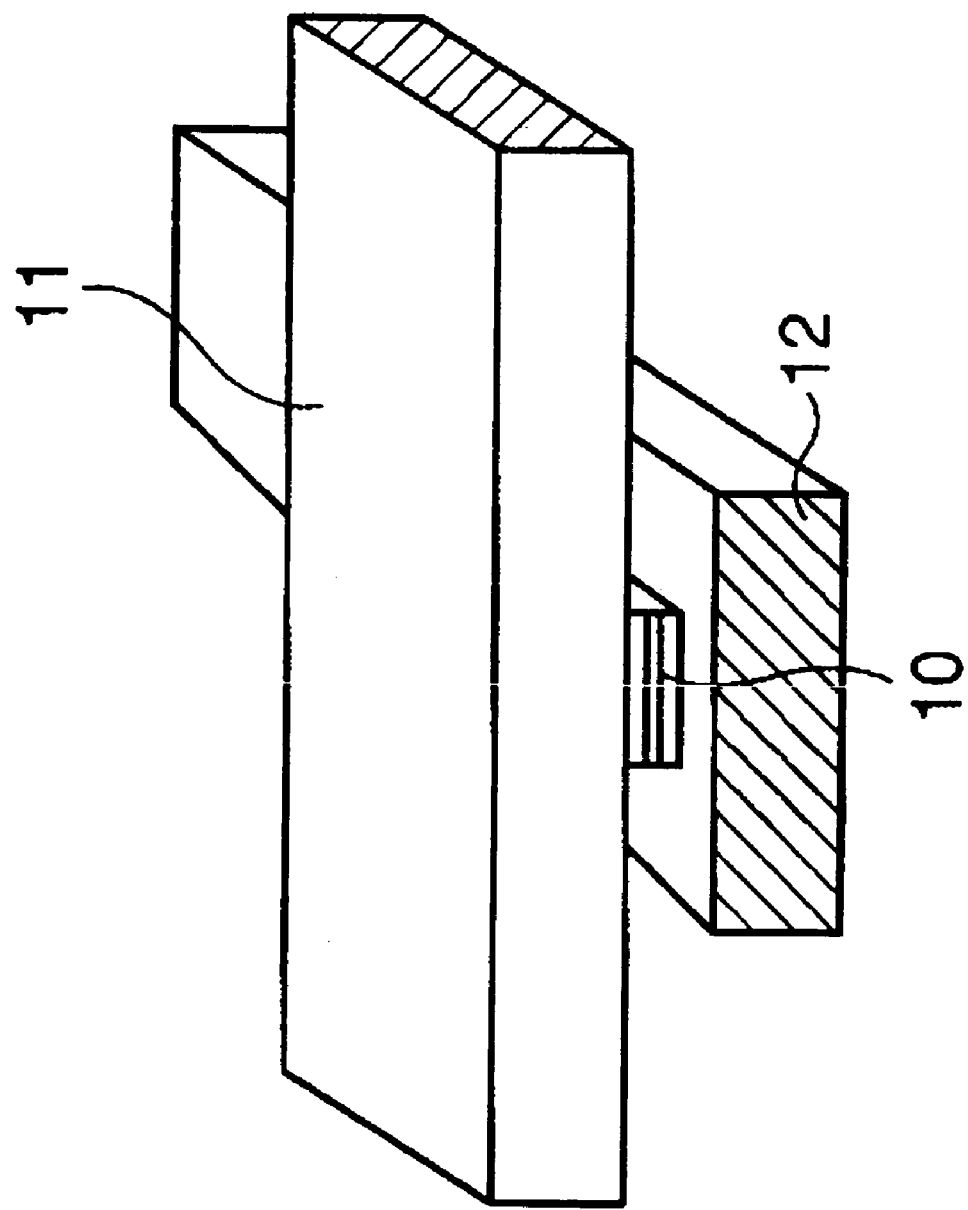
FIG. 6 is a partially perspective view of an exemplary configuration of a portion for the stacked memory cell array as illustrated in FIG. 5.
Figure 7:
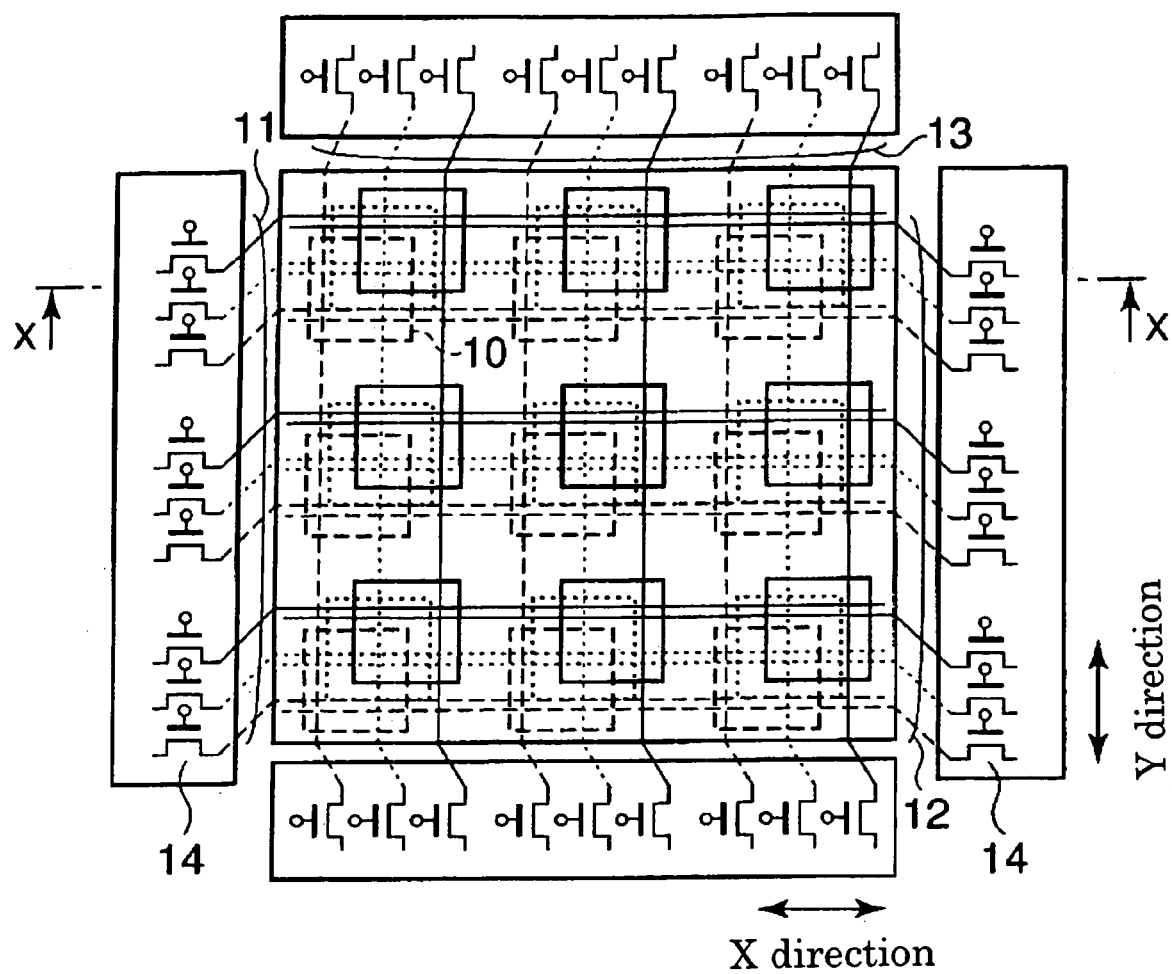
FIG. 7 is a plain view of an exemplary configuration of a background technique of a stacked cell arrays proposed by the same assignee of the present invention.
Figure 8:
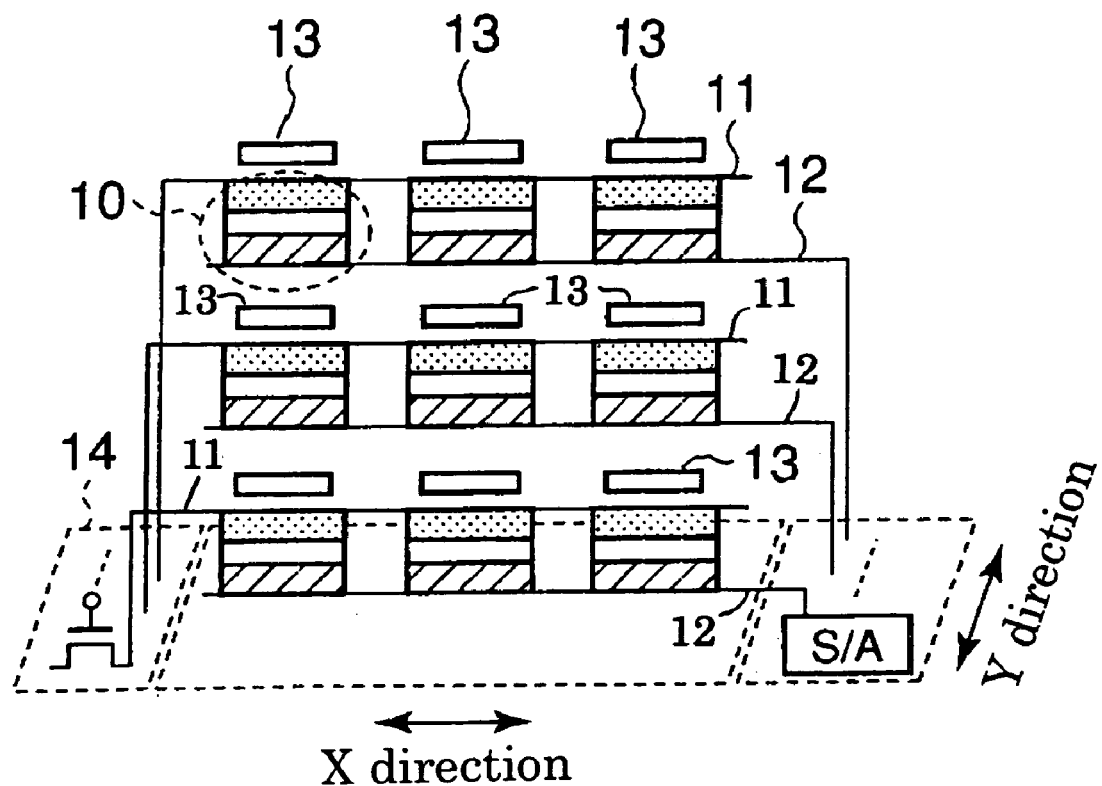
FIG. 8 a cross section view of an exemplary configuration of the stacked cell arrays of the background technique which is obtained by cutting along an X—X line (X direction) as illustrated in FIG. 7.

A method for performing read/write operations may be now explained by selecting a TMR element 10 at one row and one column. As explained above, one column includes a plurality of TMR elements 10 disposed in a Y (column) direction, and one row includes a plurality of TMR elements disposed in X (row) direction. As shown in FIG. 6, a top and bottom wirings 11 and 12 may operate as read wirings. The bottom wiring 12 operates as a read wiring during a read operation, it also operates as a write wirings during a writing operation.

To perform a read operation, a first read current is supplied to both top and bottom wirings 11 and 12 in a selected one column. The read current flows through a path passing from a top wiring 11 to a bottom wiring 12 through a TMR element 10. An electric potential of the bottom wiring 12 is detected by a sense amplifier (not shown) through a selection transistor 14 as a first potential. And a predetermined digit data "0" or "1" is written in a selected TMR element 10. Next, a second read current is supplied to both top and bottom wirings 11 and 12 in a next selected one column. Then, an electric potential of the bottom wiring 12 is detected through the selection transistor 14 as a second potential. If the detected first and second electric potentials are substantially equal with other, it is judged that the read data of the selected TMR element 10 is equal to the predetermined data. On the contrary, if the electric potentials of the first and second detection time are different with each other, it is judged that the data of the selected TMR element 10 is different from the predetermined data. Thus, a correct data is re-written on the selected TMR element 10.

To perform data writing operation, a write current towards one direction or an opposite direction is supplied to a bottom wiring 12 in one selected column in accordance with a value of the write data. Simultaneously, a write current is supplied to a write wiring 13 in the selected one row toward one direction. By doing this, a predetermined data is written in a selected TMR element 10 disposed between the selected top and bottom wirings 11 and 12.

According to this structure of the stacked cell array consistent with the invention, it becomes possible to gradually restrain the parasitic resistance by gradually forming thicker of the film thickness of the write wiring 13 accompanying to the top plane level so as to keep the write current at a substantially equal value at every plane level. Consequently, even when the TMR elements 10 in each of plane levels are made by the same material, the same thickness and the same size, it becomes possible to keep the same current value of the write wirings in every plane level. Thus, it becomes possible to realize a magnetic random access memory of a larger capacity, since an equal current magnetic field may occur for any of the TMR elements.

Figure 3:
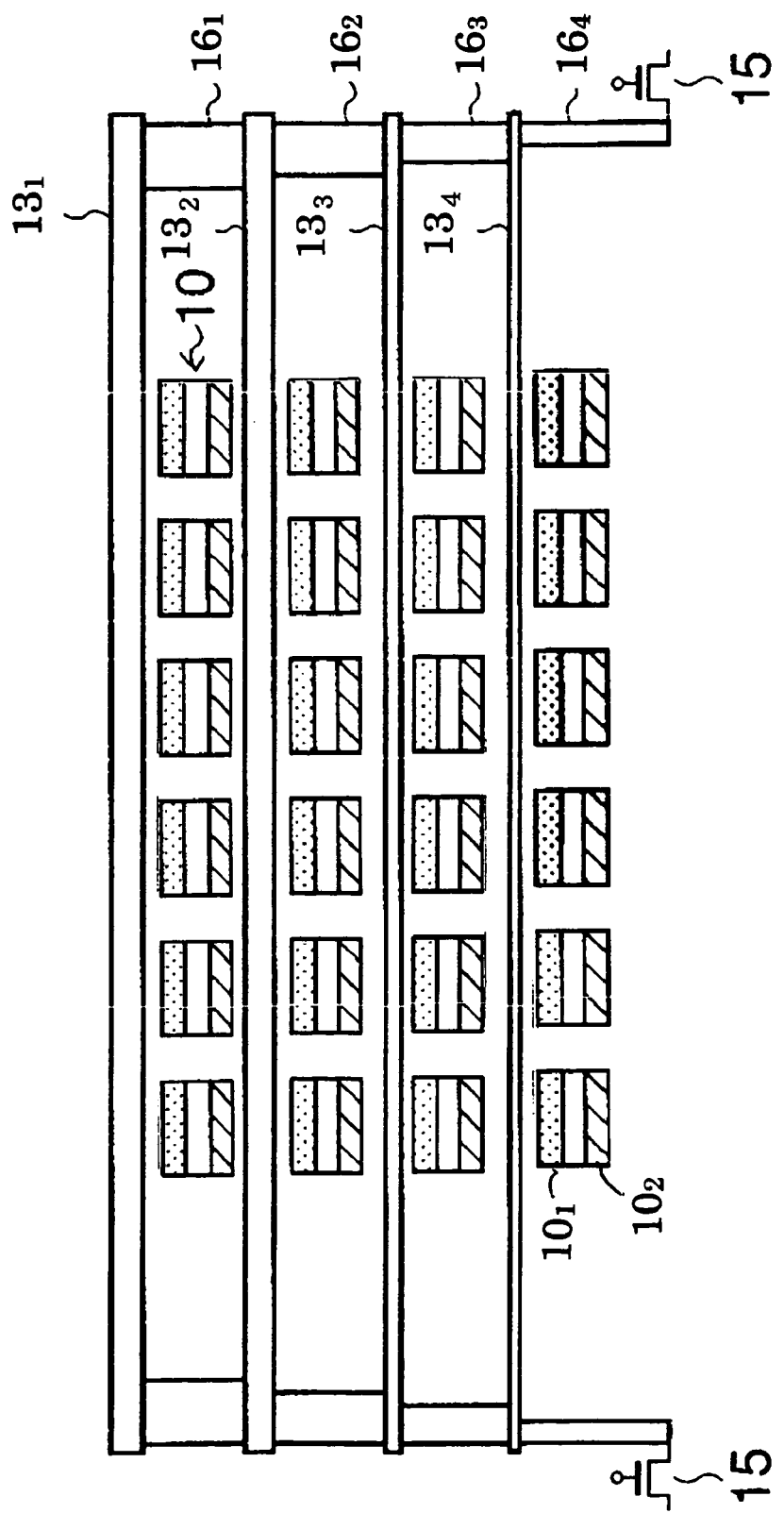
FIG. 3 is a cross section view of another exemplary configuration of the stacked cell arrays being constructed by exemplary four different thicknesses of write wiring films and four different sizes of contact plugs which are obtained by cutting along a Y—Y line [Y (column) direction] as illustrated in FIG. 1.

FIG. 3 explain another embodiment of a magnetic random access memory consistent with the resent invention. As explained in the embodiment illustrated in FIG. 2, the structure of this stacked memory cell array includes a plurality of write wiring $13_1$–$13_4$ being formed gradually thicker accompanying approach to the top layer level. According to this embodiment, further the plurality of contact plugs $16_1$–$16_4$ also is formed by gradually changing each size connecting between an upper wiring and a lower wiring accompanying approach to the top plane level. For example, the size of the contact plugs $16_1$ connecting between the top and second wirings $13_1$, $13_2$ is larger than the size of the contact plugs $16_2$ connecting between the second and third wirings $13_2$, $13_3$ and so on. By combining the changes of the film thickness of the wirings and the sizes of the contacts connecting two film wirings in a column direction, it becomes possible much easier to restrict parasitic resistance accompanying approach to the top layer level. Consequently, this configuration can increase writing margins in a larger capacity size of memory, since it becomes possible to maintain a value of write current in each plane level.

Figure 4:
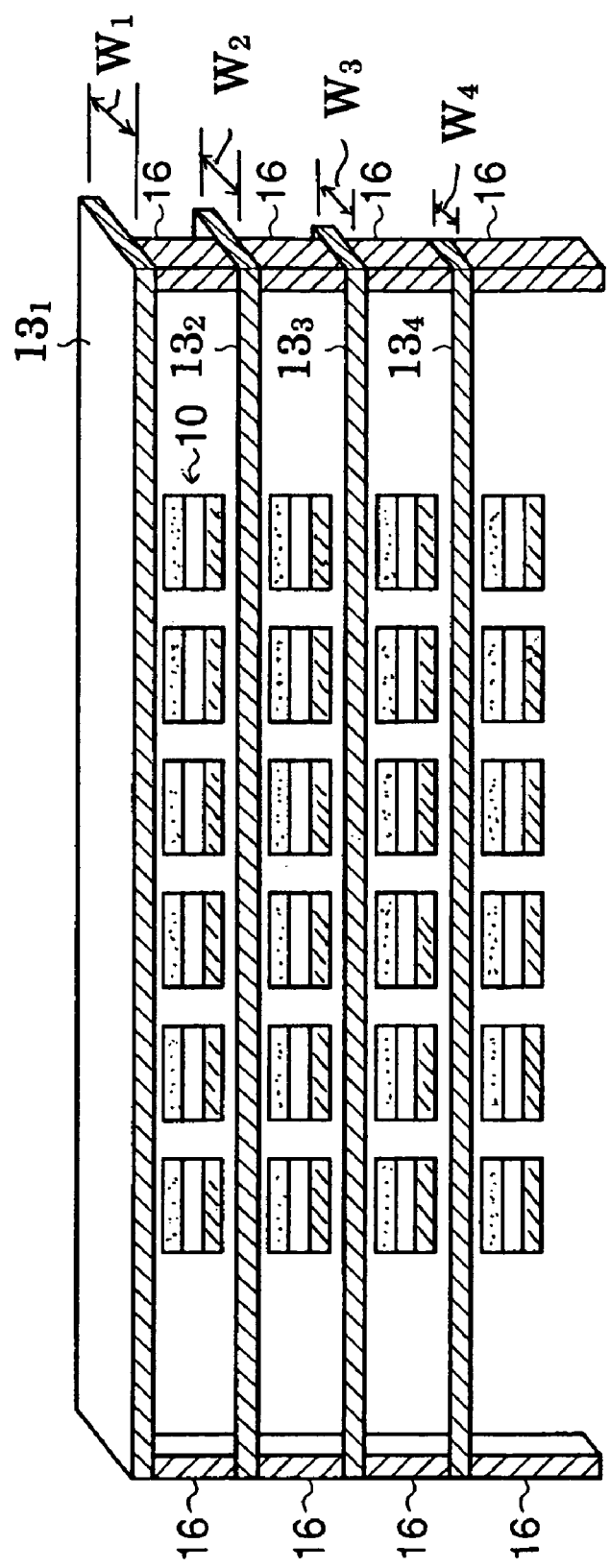
FIG. 4 is a partially perspective view of a further exemplary configuration of the stacked cell arrays being constructed by exemplary four different widths of write wirings which are obtained by cutting along a Y—Y line (Y direction) as illustrated in FIG. 1.

FIG. 4 illustrates a further example of a structure of the magnetic random access memory consistent with the invention, in which both the plurality of write wiring films $13_1$–$13_4$ and contact plugs 16 are shown as a perspective view along a Y (row) direction. As shown in FIG. 4, the stacked cell array 100 includes a plurality of write wirings $13_1$–$13_4$, each having different widths $W_1$–$W_4$. Thus, the width of the respective write wiring films becomes gradually wider accompanying approach to the top layer level. This structure of gradually change of width of write wirings also is capable to restrain the parasitic resistance which increases toward the top layer level. By restricting such increase of the parasitic resistance, it also becomes possible to increase writing margins of a large capacity memory.

As a modification of the above mentioned embodiments, it is possible to combine the structures such as explained in FIGS. 3 and 4. Thus, it may combine the wider structure of the thicker film write wiring and the larger size of the contact accompanying approach to the top plane level. Further, it is possible to combine the wider structure of the write wiring and the thicker film structure of the wiring approaching to the top film as illustrated in FIG. 1.

It is also possible to use different resistance value as a material of the contact plugs 16 for a different plane level. Thus, it may use a material of the smallest value of resistance for connecting the top layer. And a smaller value of resistance for connecting the middle layers. By combing these features, it becomes possible to accurately control the parasitic resistances for each of the write wirings so that each of the writing currents keeps substantially at the same value at each layer.

Figure 5:
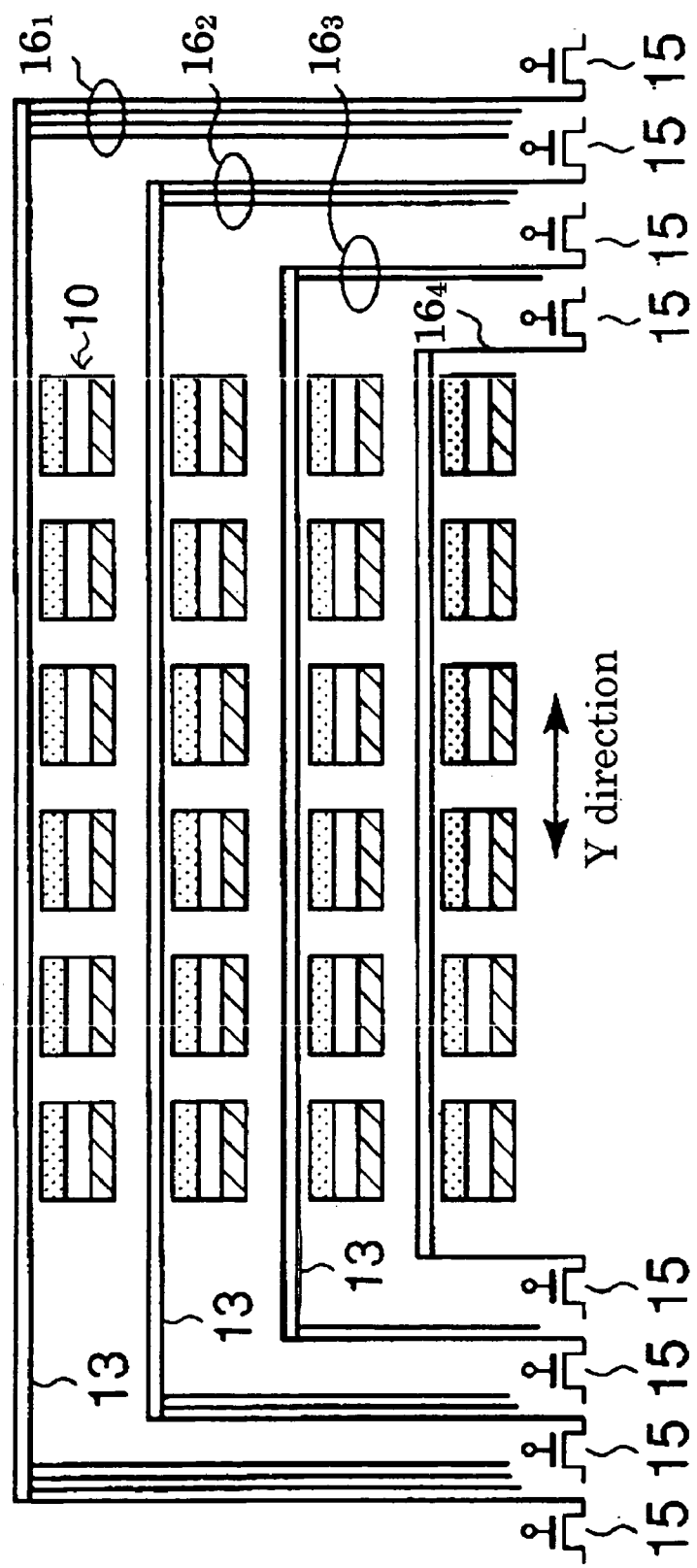
FIG. 5 is a cross section view of a still further exemplary configuration of the stacked cell arrays which are obtained by cutting along a X—X line [X (row) direction] as illustrated in FIG. 1.

In the above explained examples, the stacked cell arrays are structured so that each wiring films disposed in each of the plane levels are connected in a parallel. However, it is also possible to independently use the write wiring for the respective plane levels as illustrated in FIG. 5. This example structure of the magnetic random access memory consistent with the invention is constructed so that each of the write wring for the respective plane levels is independently connected to a respective write selection transistor 15. In this embodiment, as similar to the embodiment explained in FIG. 2, the numbers of contact plugs 16 for connecting write wirings to the write selection transistor 15 may increase accompanying approach to the top plane levels. Thus, the largest number of contact plugs $16_1$ is formed at the top plane level. From the FIG. 5, it may be seem that all of the contact plugs $16_1$–$16_4$ are formed by only one process. However, as a practically, each of the contact plugs 16 are respectively formed by each of the inter-plane levels. According to this structure, it becomes possible to keep the write current at an equal value by restraining the parasitic resistances since it may independently designate a resistance value of the contact. Consequently, it becomes possible to increase writing margins for a large capacity memory.

As a modification of FIG. 5, it is possible to keep the same number of contact plugs 16 for the respective layer levels so that the size of the contact plugs 16 gradually increase toward the upper layer, as explained in FIG. 3. Also, it is possible to change both the number of the contact plugs 16 and the contact size in accordance with the respective wirings for each of the layer levels so that both of the number and the size for the upper layer gradually increase. Further, it is possible to form so that the contact resistances of the contact plugs corresponding to a top plane level becomes smaller. Practically, if the wiring film is disposed at a top level, the sizes of the corresponding contact plugs may be made larger, or a material of a smaller resistance value is used as the contact plugs. Further, each of the materials for both each of the write wirings and each of the contact plugs can be use a smaller value accompanying approach to the top plane level.

These structures are beneficial for increasing the writing margin, because each of the writing currents at each of the stacked layers can keep at the substantially same value by independently designating each contact resistance in order to restrain the parasitic resistances at an upper plane level. As proposed in the above-mentioned Japanese Application Publication 2002-110933, it is also possible to gradually increase the number s of the TMR elements form the bottom plane and to the top plane level.

FIG. 6 explains still further example of MRAM of stacked memory cell arrays consistent with the present invention. This structure is referred to a cross point type memory cell array in which an upper wiring 11 on TMR elements 10 is commonly used as a first write wiring and a first read wiring, and a lower wiring 12 of TMR elements 10 is also commonly used as a second write wiring and a second read wiring. TMR elements 10 are disposed at a cross points between the two wirings 11 and 12. The present invention can be applicable to a stacked memory cell array of such a cross point type structure.

It is also possible to employ such a structure that the wirings having the same function, for example, the wirings disposed in the bottom plane are connected to a transistor arranged near to the TMR element array and the wirings disposed in the top plane a transistor arranged far distance from the TMR element array. By doing this, with regards to the winding having the same function disposed in the TMR element array, the wirings for the top plane are disposed at a far distance from the TMR element array comparing to the wirings disposed at the bottom plane. In this case, the transistors connected to a wiring in one row are arranged in a line from a near position to the array toward a distant position. This becomes possible to determine a pitch of the TMR element without receiving influences of a pitch of the transistors. Consequently, it becomes possible to realize a miniaturization of the TMR elements and a highly integration. It is also possible to combine each of the above-described embodiments in order to simplify a device designing.

In the above-described embodiments, the write wirings are disposed in each of the plurality of plane levels for the stacked TMR elements. However, it is also possible to dispose the wirings having the same function one by one plane level without disposing at each of the plane level in order to commonly use the wirings for the TMR element of both an upper and a lower plane level. Generally a MOS transistor is used as the transistor connected to the wiring in the TMR element array. Of cause, it is possible to use a bipolar transistor or a diode for connecting the wirings. In short, the present invention is applicable to any type of magnetic random access memory structure in which a plurality of TMR elements is stacked in an array of a plurality of plane levels.

As explained above, the described magnetic random access memory consistent with the present invention may avoid occurrence of the reduction of the writing current caused by the influences of parasitic wiring resistances and miniaturization. Thus, it may protect occurrence of error writing in a small writing margin of a TMR element by efficiently control the value of the writing current Other embodiments of the invention will be apparent to those skilled in the art from consideration of the specification and practice of the invention disclosed herein. It is intended that the specification and examples be considered as exemplary only, with a true scope of and sprit of the invention being indicated by the following claims.

What is claimed is:

1. A magnetic random access memory, comprising:
   a plurality of stacked cell arrays, each of said plurality of stacked cell arrays including a plurality of array planes of a plurality of TMR elements, each of TMR elements including a pair of terminals and an insulation layer interposed between a couple of ferromagnetic layers;
   a plurality of write wiring films, each of said plurality of write wiring films disposed on a TMR element of a corresponding stacked cell array and configured to supply a write current to said corresponding TMR element, wherein said plurality of write wiring films are configured so that a write wiring film parasitic resistance value decreases as a distance between a corresponding array plane and a common write wiring current source increases; and
   a plurality of contact plugs, each of said plurality of contact plugs coupled to a corresponding array plane terminal and configured to supply the write current to a corresponding write wiring film, said plurality of contact plugs connected in series with said common write wiring current source.

2. A magnetic random access memory, comprising:
   a plurality of stacked cell arrays, each of said plurality of stacked cell arrays including a plurality of array planes of a plurality of TMR elements, each of TMR elements including a pair of terminals and an insulation layer interposed between a couple of ferromagnetic layers;
   a plurality of write wiring films, each of said plurality of write wiring films disposed on a TMR element of a corresponding stacked cell array and configured to supply a write current to said corresponding TMR element, wherein said plurality of write wiring films are configured so that a write wiring film parasitic resistance value decreases as a distance between a corresponding array plane and a respective write wiring current source increases; and
   a plurality of contact plugs, each of said plurality of contact plugs coupled to a corresponding array plane terminal and configured to supply the write current to a corresponding write wiring film, said plurality of contact plugs connected in parallel with respective write wiring current sources.

3. The magnetic random access memory according to claims 1 or 2, wherein each of said plurality of write wiring films comprises:
   a corresponding write wiring film thickness value, each of said corresponding write wiring film thickness values configured to be larger as a distance between a corresponding array plane and a respective write wiring current source increases.

4. The magnetic random access memory according to claims 1 or 2, wherein each of said plurality of write wiring films comprises:
   a corresponding write wiring film width value, each of said corresponding write wiring film width values configured to be larger as a distance between a corresponding array plane and a respective write wiring current source increases.

5. The magnetic random access memory according to claims 1 or 2, wherein each of said plurality of write wiring films comprises:
a corresponding write wiring film resistance value, each of said corresponding write wiring film resistance values configured to be smaller as a distance between a corresponding array plane and a respective write wiring current source increases.

6. The magnetic random access memory according to claims 1 or 2, wherein each of said plurality of contact plugs comprises:
a corresponding contact plug resistance value, each of said corresponding contact plug resistance values configured to be smaller as a distance between a corresponding array plane and a respective write wiring current source increases.

7. The magnetic random access memory according to claim 6, wherein said plurality of contact plugs comprise:
a top plane contact plug, said top plane contact plug having a larger size than a lower level contact plug.

8. The magnetic random access memory according to claim 6, wherein said plurality of contact plugs comprise:
a top plane contact plug, said top plane contact plug having a smaller resistance value than a lower level contact plug.

9. The magnetic random access memory according to claim 2, wherein each of said plurality of contact plugs comprises:
a corresponding contact plug resistance value, each of said corresponding contact plug resistance values configured to be smaller as a distance between a corresponding array plane and a respective write wiring current source increases.

10. The magnetic random access memory according to claim 9, wherein each of said plurality of contact plugs comprises:
a corresponding number of contact plugs, each of said corresponding number of contact plugs larger as a distance between a corresponding array plane and a respective write wiring current source increases.

11. The magnetic random access memory according to claim 9, wherein each of said plurality of contact plugs comprises:
a corresponding contact plug size, each of corresponding contact plug sizes larger as a distance between a corresponding array plane and a respective write wiring current source increases.

12. The magnetic random access memory according to claims 1 or 2, wherein each of said plurality of contact plugs comprises:
a corresponding contact plug resistance value, each of said corresponding contact plug resistance values larger as a distance between a corresponding array plane and a respective write wiring current source increases.

13. A method for manufacturing a magnetic random access memory, comprising:
stacking cell arrays constructed by a plurality of array planes of a plurality of TMR elements, each of TMR elements being structured by interposing an insulation layer between a couple of ferromagnetic layers;
disposing a plurality of write wirings on a corresponding plurality of the stacked cell arrays in order to supply a write current to each of the TMR elements, said plurality of write wirings being formed so that a write wiring film parasitic resistance value decreases as a distance between a corresponding array plane and a common write wiring current source increases;
serially connecting terminals of said stacked cell arrays by a plurality of contact plugs; and
connecting said common write wiring current source to said plurality of contact plugs.

14. The method for manufacturing a magnetic random access memory according to claim 13, wherein said step of disposing a plurality of write wirings comprises:
disposing thicker write wirings as a distance between a corresponding array plane and a common write wiring current source increases.

15. The method for manufacturing a magnetic random access memory according to claim 13, wherein said step of disposing a plurality of write wirings comprises:
disposing wider write wirings as a distance between a corresponding array plane and a common write wiring current source increases.

16. The method for manufacturing a magnetic random access memory according to claim 13, wherein said step of disposing a plurality of write wirings comprises:
disposing write wirings having smaller resistance values as a distance between a corresponding array plane and a common write wiring current source increases.

* * * * *